US008791745B2

(12) United States Patent
Huang

(10) Patent No.: US 8,791,745 B2
(45) Date of Patent: Jul. 29, 2014

(54) LINEAR VOLTAGE STABILIZING CIRCUIT

(75) Inventor: Yong-Zhao Huang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 635 days.

(21) Appl. No.: 13/110,933

(22) Filed: May 19, 2011

(65) Prior Publication Data

US 2012/0256608 A1 Oct. 11, 2012

(30) Foreign Application Priority Data

Apr. 7, 2011 (CN) .......................... 2011 1 0086495

(51) Int. Cl.
*H03K 17/687* (2006.01)

(52) U.S. Cl.
USPC ............ 327/427; 327/432; 327/391; 327/538

(58) Field of Classification Search
None
See application file for complete search history.

(56) References Cited

U.S. PATENT DOCUMENTS

| | | | | |
|---|---|---|---|---|
| 5,475,332 | A * | 12/1995 | Ishimoto | 327/427 |
| 5,502,416 | A * | 3/1996 | Pietrobon | 327/538 |
| 5,570,061 | A * | 10/1996 | Shimoda | 327/545 |
| 6,060,943 | A * | 5/2000 | Jansen | 327/538 |
| 6,667,652 | B2 * | 12/2003 | Hosoki | 327/538 |
| 6,696,887 | B2 * | 2/2004 | Taubman | 327/560 |
| 6,756,839 | B2 * | 6/2004 | Hall et al. | 327/538 |
| 7,102,415 | B1 * | 9/2006 | Potanin et al. | 327/427 |
| 8,502,587 | B2 * | 8/2013 | Dhuyvetter et al. | 327/265 |
| 2002/0050853 | A1 * | 5/2002 | Hosoki | 327/538 |

FOREIGN PATENT DOCUMENTS

CN 1667536 A 9/2005

* cited by examiner

*Primary Examiner* — Tuan T Lam

(74) *Attorney, Agent, or Firm* — Novak Druce Connolly Bove + Quigg LLP

(57) ABSTRACT

A linear voltage stabilizing circuit includes a main stabilizing unit, a first resistor, a second resistor, and a sub-stabilizing unit. The main stabilizing unit includes a first transistor connected between a signal input terminal and a signal output terminal, and a first comparator controlling the first transistor. The first and the second resistor are connected between the signal input terminal and ground. The voltage between the first resistor and the second resistor is equal to a first reference voltage. The sub-stabilizing unit includes a third resistor, a fourth resistor, a second transistor connected between the signal input terminal and the first transistor, and a second comparator. The third and fourth resistor are connected between the second comparator and ground. The node of the third and fourth resistor is connected to the node between the first and the second resistor. The second comparator controls the second transistor turn on or off.

9 Claims, 3 Drawing Sheets

LINEAR VOLTAGE STABILIZING CIRCUIT

BACKGROUND

1. Technical Field

The present disclosure relates to a linear voltage stabilizing circuit.

2. Description of Related Art

A linear voltage stabilizing circuit having only one transistor is widely used to decrease voltage. Electrical elements need more current and a high power transistor. However, the high power transistor is not only expensive, but it also produces excessive heat, thereby affecting the performance of the electronic elements adjacent to the high power transistor.

BRIEF DESCRIPTION OF THE DRAWING

Many aspects of the embodiments can be better understood with reference to the following drawing. The components in the drawing are not necessarily drawn to scale, the emphasis instead being placed upon clearly illustrating the principles of the embodiments.

DETAILED DESCRIPTION

Embodiments of the present disclosure are described in detail as follows, with reference to the accompanying drawings.

Figure 1:
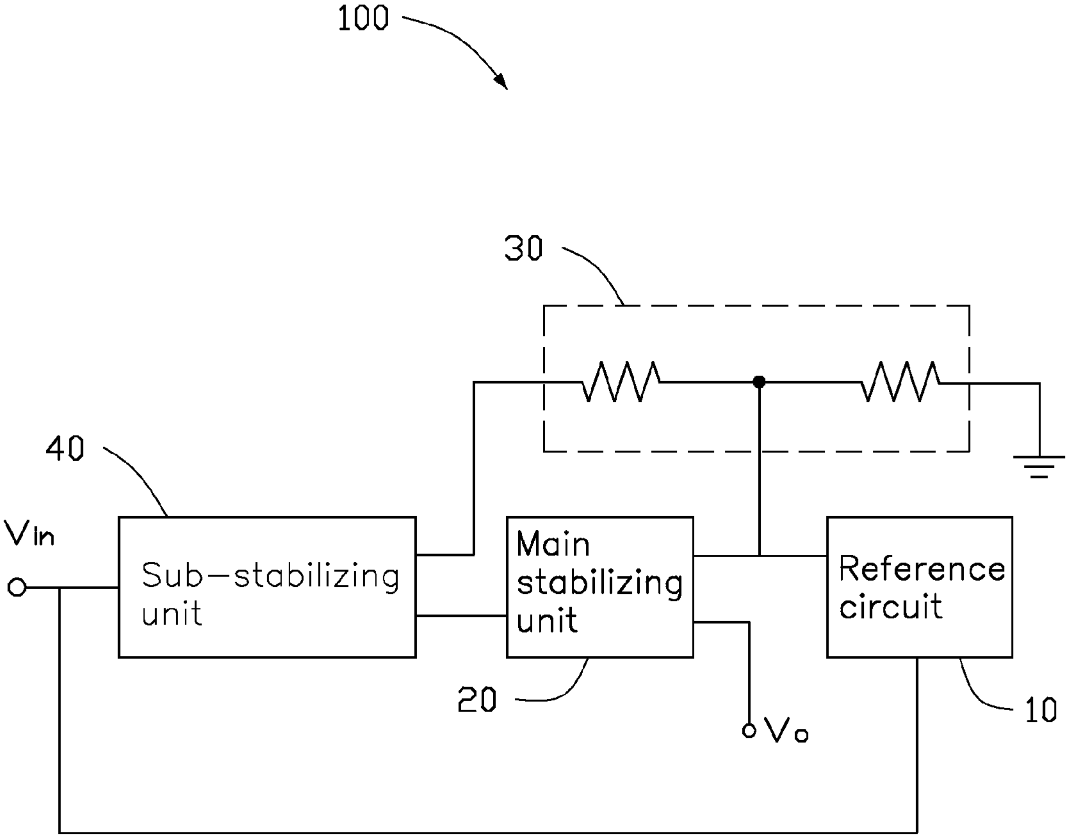
FIG. 1 is a block diagram of a linear voltage stabilizing circuit according to a first embodiment.
Figure 2:
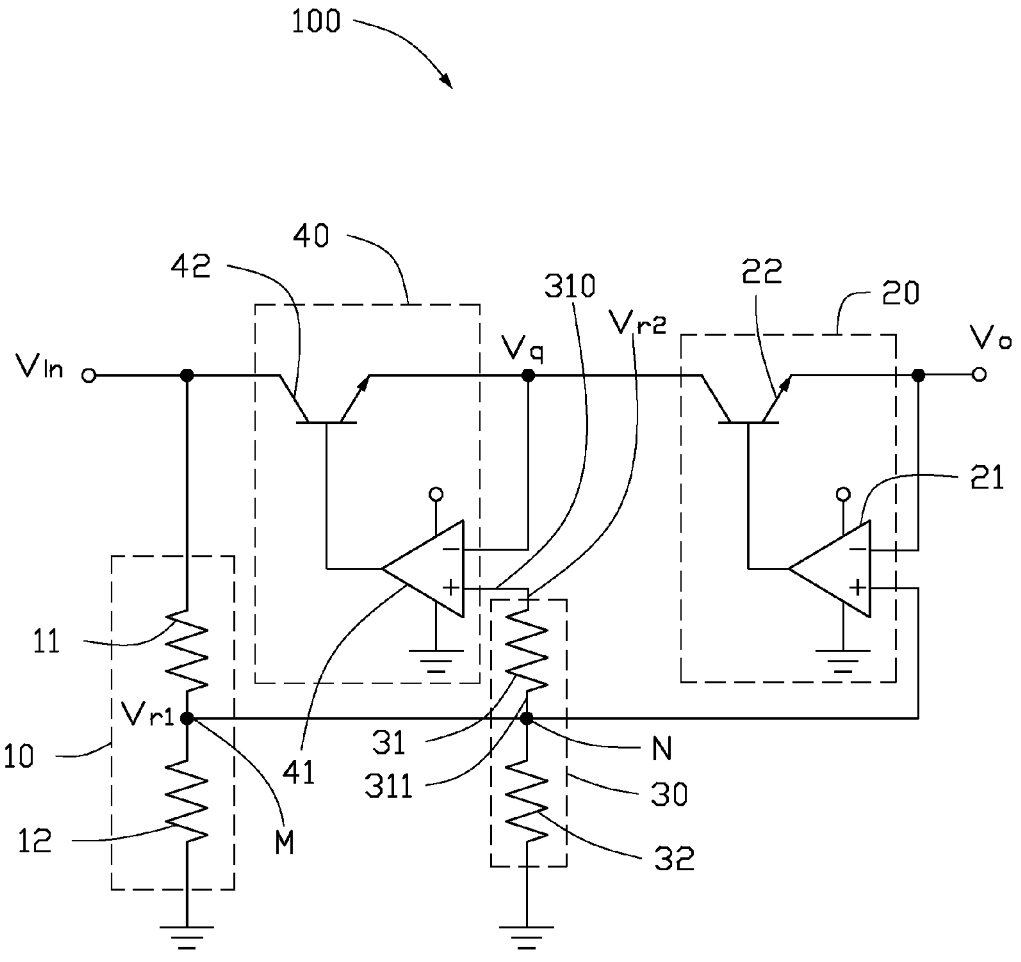
FIG. 2 is a circuit diagram of the linear voltage stabilizing circuit of FIG. 1.

Referring to the FIGS. 1 and 2, a linear voltage stabilizing circuit 100, according to a first exemplary embodiment is shown. The linear voltage stabilizing circuit 100 is electrically connected between a signal input terminal Vin and a signal output terminal Vo. The linear voltage stabilizing circuit 100 decreases voltage from the signal input terminal Vin to a lower voltage, and outputs the lower voltage to the signal output terminal Vo. The linear voltage stabilizing circuit 100 includes a reference circuit 10, a main stabilizing unit 20, a power adjusting circuit 30, and a sub-stabilizing unit 40. The power adjusting circuit 30 is connected to the reference circuit 10, the main stabilizing unit 20, and the sub-stabilizing unit 40. The reference circuit 10 is connected to the main stabilizing unit 20. The sub-stabilizing unit 40 is connected between the main stabilizing unit 20 and the signal input terminal Vin.

The reference circuit 10 includes a first resistor 11 and a second resistor 12. The first resistor 11 is connected between the signal input terminal Vin and the second resistor 12. The other end of the second resistor 12 is connected to ground. A voltage of a node M between the first resistor 11 and the second resistor 12 is defined as a reference voltage Vr1. The first reference voltage Vr1 satisfies the following formula: $Vr1=Vi\times R12/(R11+R12)$, where Vi represents the input voltage of the signal input terminal Vin, R11 represents the resistance of the first resistor 11, and R12 represents the resistance of the second resistor 12. The first reference voltage Vr1 is set by the first resistor 11 and the second resistor 12. In the present embodiment, the first reference voltage Vr1 is set to a preset output voltage of the signal output terminal Vo by adjusting the resistances of the first and second resistors 11, 12.

The main stabilizing unit 20 includes a first comparator 21 and a first transistor 22. A positive input terminal of the first comparator 21 is electrically connected to the node M between the first resistor 11 and the second resistor 12 for obtaining the first reference voltage Vr1. A negative input terminal of the first comparator 21 is electrically connected to the signal output terminal Vo. An output terminal of the first comparator 21 is electrically connected to the base of the first transistor 22. The emitter of the first transistor 22 is electrically connected to the signal output terminal Vo. The collector of the first transistor 22 is electrically connected to the sub-stabilizing unit 40. The first comparator 21 compares the voltage of the signal output terminal Vo and the first reference voltage Vr1. When the voltage of the signal output terminal Vo is less than the first reference voltage Vr1, the first comparator 21 outputs a high level voltage to the first transistor 22 for turning on the first transistor 22. The first transistor 22 provides a current Io to increase the voltage of the signal output terminal Vo. When the voltage of the signal output terminal Vo is greater than the first reference voltage Vr1, the first comparator 21 outputs a low level voltage to the first transistor 22 for turning off the first transistor 22. The voltage of the signal output terminal Vo decreases. The voltage of the signal output terminal Vo maintains a stable voltage.

The power adjusting circuit 30 includes a third resistor 31 and a fourth resistor 32. The third resistor 31 includes a first terminal 310 and a second terminal 311. The first terminal 310 is electrically connected to the sub-stabilizing unit 40. The fourth resistor 32 is connected between the second terminal 311 and ground. The resistance of the fourth resistor 32 is the same as that of the second resistor 12. The node N between the third resistor 31 and the fourth resistor 32 is electrically connected to the node M between the first resistor 11 and the second resistor 12.

The sub-stabilizing unit 40 includes a second comparator 41 and a second transistor 42. A positive input terminal of the second comparator 41 is electrically connected to the first terminal 310 of the third resistor 31 for obtaining a second reference voltage Vr2 from the first terminal 310. The second reference voltage Vr2 satisfies the following formula: $Vr2=Vi\times(R31+R32)/(R11+R12)$, where R31 represents the resistance of the third resistor 31, and R32 represents the resistance of the fourth resistor 32. The negative input terminal of the second comparator 41 is electrically connected to the emitter of the second transistor 42 for obtaining the output voltage Vq of the second transistor 42. The output voltage Vq is changed to equal to Vr2 by the sub-stabilizing unit 40. The output terminal of the second comparator 42 is electrically connected to the base of the second transistor 42. The collector of the second transistor 42 is electrically connected to the signal input terminal Vin. The emitter of the second transistor 42 is electrically connected to the collector of the first transistor 22. The second comparator 41 compares the second reference Vr2 with the output voltage Vq. When the voltage of the output voltage Vq is less than the second reference voltage Vr2, the second comparator 41 outputs a high level voltage to the second transistor 42 for turning on the second transistor 42. The voltage of the output voltage Vq increases. When the voltage of the output voltage Vq is greater than the second reference voltage Vr2, the second comparator 41 outputs a low level voltage to the second transistor 42 for turning off the second transistor 42. The output voltage Vq is decreased. The output voltage Vq is adjusted to be substantially equal to the second reference Vr2.

The total power PT of the linear voltage stabilizing circuit 100 satisfies the formula: $PT=(Vi-Vout)\times Io$, where Vi represents the voltage of the signal of the signal input terminal Vin, Vout represents the voltage of the signal output terminal Vo, Io represents the output current of the linear voltage stabilizing circuit 100. The current Io is equal to a current $Io_2$ through the first transistor 22 and the second transistor 42, because the current through the third resistor 31 and the fourth resistor 32 is very small. The total power PT of the linear voltage stabilizing circuit 100 satisfies the formula: PT=P22+P42, where P22 represents the power of the first transistor 22, P42 represents the power of the second transistor 42. The power P22 of the first transistor 22, and the power P42 of the second transistor 42 satisfy the formulas:

$$
\begin{aligned}
P22 &= I_{O2} \times (V_q - V_{out}) \\
&= I_{O2} \times \left[\frac{V_i \times (R31 + R32)}{R11 + R12} - \frac{V_i \times R12}{R11 + R12}\right] \\
&= \frac{I_{O2} \times V_i R31}{R11 + R12};
\end{aligned}
$$

$$
\begin{aligned}
P42 &= I_{O2} \times (V_i - V_q) \\
&= I_{O2} \times \left[V_i - \frac{V_i \times (R31 + R32)}{R11 + R12}\right] \\
&= \frac{I_{O2} \times V_i \times (R11 - R31)}{R11 + R12}.
\end{aligned}
$$

The power distribution between the first transistor 22 and the second transistor 42 can be changed by changing the resistance of the first resistor 11, when the resistances of the third resistor 31 and the fourth resistor 32 are unchanged.

Figure 3:
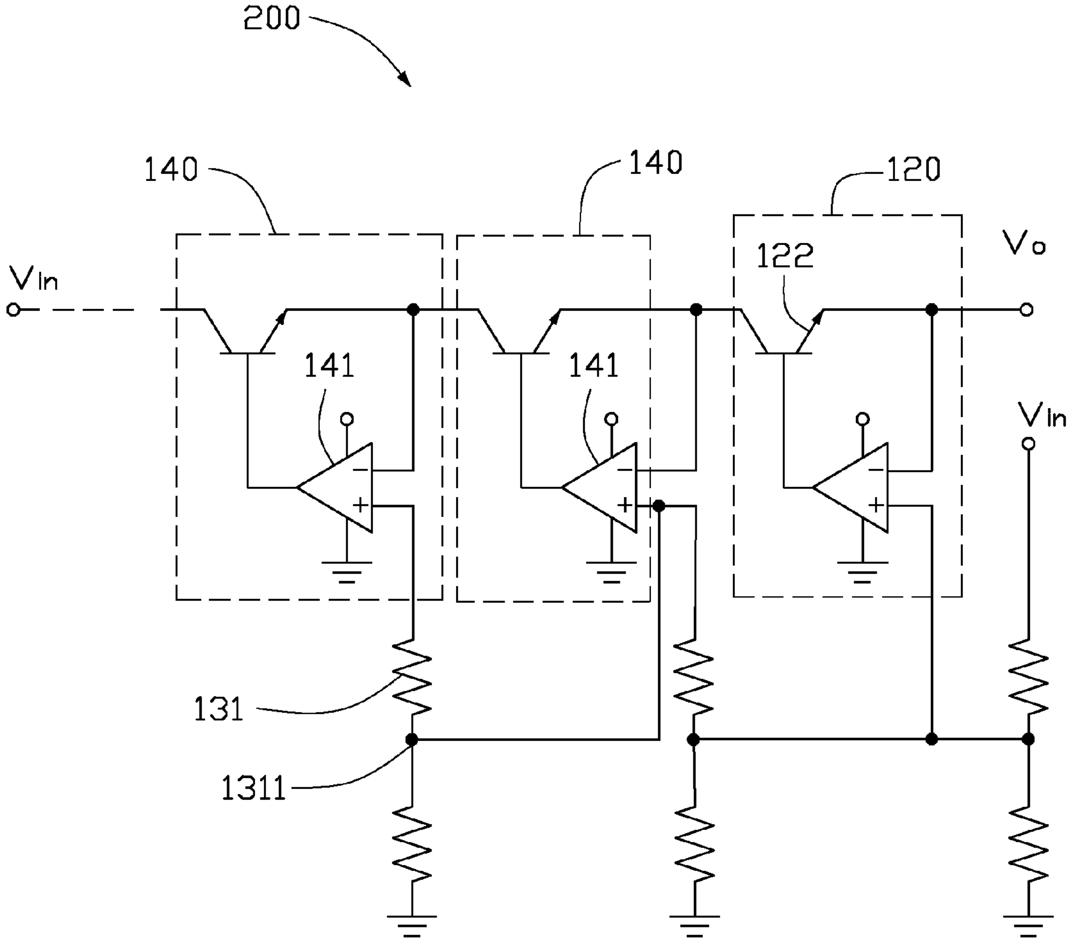
FIG. 3 is a block diagram of a linear voltage stabilizing circuit according to a second embodiment.

Referring to FIG. 3, a linear voltage stabilizing circuit 200 with a number of sub-stabilizing units 140, according to a second exemplary embodiment is shown. The sub-stabilizing units 140 are connected in series between the signal input terminal Vin and the main stabilizing unit 120. The sub-stabilizing units 140 are connected to a main stabilizing unit 120. A second transistor 142 of each sub-stabilizing units 140 is connected in series between the signal input terminal Vin and the first transistor 122. A second comparator 141 of each sub-stabilizing units 140 is respectively connected to the second transistor 142 in the same way as the first exemplary embodiment. A second terminal 1311 of a third resistor 131 between each two sub-stabilizing units 140 is electrically connected to the positive input terminal of the second comparator 141 of the former sub-stabilizing units 140.

While certain embodiments have been described and exemplified above, various other embodiments will be apparent to those skilled in the art from the foregoing disclosure. The present disclosure is not limited to the particular embodiments described and exemplified, and the embodiments are capable of considerable variation and modification without departure from the scope of the appended claims.

What is claimed is:

1. A linear voltage stabilizing circuit, comprising:

a main stabilizing unit comprising:

a first transistor connected between a signal input terminal and a signal output terminal;

a first comparator configured for comparing output voltage of the first transistor and a first reference voltage to control the first transistor turn on or turn off;

a first resistor connected to the signal input terminal;

a second resistor connected to the first resistor, the voltage of a node between the first resistor and the second resistor being about equal to the first reference voltage;

a sub-stabilizing unit comprising:

a second transistor connected in series between the signal input terminal and the first transistor;

a third resistor;

a fourth resistor connected between the third resistor and ground, and a node between the fourth resistor and the third resistor electrically connected to the node between the first resistor and the second resistor;

a second comparator connected to the second transistor, and the second comparator comparing the output voltage of the second transistor and a second reference voltage of the node between the third resistor and the second comparator, wherein when the output voltage of the second transistor is greater than the second reference voltage, the second comparator controls the second transistor to turn on, otherwise, the second comparator controls the second transistor to turn off.

2. The linear voltage stabilizing circuit as claimed in claim 1, wherein the first reference voltage satisfies the following formula: Vr1=Vi×R12/(R11+R12), wherein Vi represents input voltage of the signal input terminal, Vr1 represents first reference voltage, R11 represents resistance of the first resistor, R12 represents resistance of the second resistor.

3. The linear voltage stabilizing circuit as claimed in claim 1, wherein collector of the second transistor is electrically connected to the signal input terminal, emitter of the second transistor is electrically connected to collector of the first transistor, a positive input terminal of the second comparator is electrically connected to the second terminal of the third resistor, a negative input terminal of the second comparator is electrically connected to the emitter of the second transistor for obtaining the output voltage of the second transistor, the output voltage satisfies the following formula: Vq=Vi×(R31+R32)/(R11+R12), wherein Vi represents the input voltage of the signal input terminal, Vq represents the output voltage of the second transistor, R11 represents the resistance of the first resistor, R12 represents the resistance of the second resistor, R31 represents the resistance of the third resistor, and R32 represents the resistance of the fourth resistor.

4. The linear voltage stabilizing circuit as claimed in claim 1, wherein the resistances of the second resistor and the fourth resistor are same.

5. The linear voltage stabilizing circuit as claimed in claim 1, wherein total power of the linear voltage stabilizing circuit satisfies the formula: PT=P22+P42, wherein PT represents the total power of the linear voltage stabilizing circuit, P22 represents the power of the first transistor, P42 represents the power of the second transistor.

6. The linear voltage stabilizing circuit as claimed in claim 5, wherein the power of the first transistor, and the power of the second transistor satisfy the formulas:

$$
\begin{aligned}
P22 &= I_{O2} \times (V_q - V_{out}) \\
&= I_{O2} \times \left[\frac{V_i \times (R31 + R32)}{R11 + R12} - \frac{V_i \times R12}{R11 + R12}\right] \\
&= \frac{I_{O2} \times V_i \times R31}{R11 + R12};
\end{aligned}
$$

$$
\begin{aligned}
P42 &= I_{O2} \times (V_i - V_q) \\
&= I_{O2} \times \left[V_i - \frac{V_i \times (R31 + R32)}{R11 + R12}\right] \\
&= \frac{I_{O2} \times V_i \times (R11 - R31)}{R11 + R12},
\end{aligned}
$$

wherein P22 represents the power of the first transistor, $I_{O2}$ represents the current through the first transistor and the second transistor, Vq represents the output voltage of the second transistor, Vout represents the voltage of the signal output terminal, Vi represents the voltage of the signal of the signal input terminal, R11 represents the resistance of the first resistor, R12 represents the resistance of the second resistor, R31 represents the resistance of the third resistor, R32 represents the resistance of the fourth resistor, P42 represents the power of the second transistor.

7. The linear voltage stabilizing circuit as claimed in claim 1, further comprising at least two sub-stabilizing units connected in series between the signal input terminal and the main stabilizing unit.

8. The linear voltage stabilizing circuit as claimed in claim 7, wherein the second transistor of each sub-stabilizing units are connected in series between the signal input terminal and the first transistor.

9. The linear voltage stabilizing circuit as claimed in claim 7, wherein the second terminal of the third resistor between each two sub-stabilizing units is electrically connected to the positive input terminal of the second comparator of a preceding sub-stabilizing unit.

* * * * *